United States Patent
Shetty et al.

(10) Patent No.: US 6,941,529 B1
(45) Date of Patent: Sep. 6, 2005

(54) METHOD AND SYSTEM FOR USING EMISSION MICROSCOPY IN PHYSICAL VERIFICATION OF MEMORY DEVICE ARCHITECTURE

(75) Inventors: Shivananda Shetty, Sunnyvale, CA (US); W. Eugen Hill, Moss Beach, CA (US); Mehrdad Mahanpour, Union City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/288,959

(22) Filed: Nov. 5, 2002

(51) Int. Cl.[7] .................. G06F 17/50; G06F 19/00; G01R 31/305; G01R 31/02
(52) U.S. Cl. .............. 716/4; 716/5; 716/21; 324/751; 324/754; 324/756; 324/758; 702/108
(58) Field of Search ............. 716/4, 21, 5; 714/755; 382/304, 149, 147, 145; 365/233, 237.1; 324/758, 756, 754, 751; 250/311, 310, 306; 702/108

(56) References Cited

U.S. PATENT DOCUMENTS

| | | | |
|---|---|---|---|
| 5,768,446 A | * | 6/1998 | Reasoner et al. ........... 382/304 |
| 5,995,647 A | * | 11/1999 | Hamada ...................... 382/145 |
| 6,038,018 A | * | 3/2000 | Yamazaki et al. ........ 356/237.1 |
| 6,553,546 B1 | * | 4/2003 | Murakami ...................... 716/4 |
| 6,586,952 B2 | * | 7/2003 | Nozoe et al. ................ 324/751 |
| 2002/0130262 A1 | * | 9/2002 | Nakasuji et al. ............. 250/311 |

* cited by examiner

Primary Examiner—A. M. Thompson
Assistant Examiner—Helen Rossoshek
(74) Attorney, Agent, or Firm—Winstead Sechrest & Minick P.C.

(57) ABSTRACT

A method and system for verifying an architecture of a semiconductor device is disclosed. The method and system include providing a tester, a detector and an image processing unit. The tester applies at least one voltage to at least one selected portion of the semiconductor device. The at least one voltage is sufficient for the at least one selected portion of the semiconductor device to produce a particular level of radiation. The detector detects the radiation. The image processing unit is coupled with the detector and the tester. The image processing unit captures an image from the detector. The image indicates at least one physical location of the at least one selected portion of the semiconductor device. The architecture of the memory device can be verified by comparing the at least one selected portion of the semiconductor device to the at least one physical location.

14 Claims, 7 Drawing Sheets

METHOD AND SYSTEM FOR USING EMISSION MICROSCOPY IN PHYSICAL VERIFICATION OF MEMORY DEVICE ARCHITECTURE

FIELD OF THE INVENTION

The present invention relates to semiconductor devices, and more particularly to a method and system for verifying the architecture of a memory device.

BACKGROUND OF THE INVENTION

Conventional semiconductor devices are designed with a specific architecture. The architecture includes specific physical locations for corresponding portions, or components, of the semiconductor device. For example, in a semiconductor memory device, each gate, each memory cell and each transistor has a set physical location on the semiconductor device. Thus, during fabrication, each portion of the semiconductor device is to be formed in the corresponding physical location set by the design.

Although the semiconductor device is designed to be fabricated with certain components having set physical locations indicated by the architecture, one of ordinary skill in the art will readily recognize that the actual physical location may not match the designed physical location. Changes in the physical location of components in the semiconductor can occur for a variety of reasons. For example, the initial design may be changed, to accommodate new features or simplify fabrication. Often, these changes in design may not be reflected in documents relating to the architecture. However, these changes result in alterations in the physical locations of certain components of the semiconductor device.

In addition, failure analysis is often performed for semiconductor devices. Semiconductor devices may have failures, such as shorts or open circuits, that arise when the semiconductor device is fabricated. Similarly, components of the semiconductor devices may fail during testing and/or operation. As a result, it is desirable to perform failure analysis to determine the type of failure that has occurred, the components affected and the location of the failure.

In order to determine which component(s) of the semiconductor device have failed, the actual physical location of portions of the semiconductor device must be matched with the designed architecture of the semiconductor device. In other words, the architecture of the semiconductor device is physically verified in order to adequately perform failure analysis.

Currently, a scanning electron microscope (SEM) might be used for conventional physical verification of the architecture of a semiconductor device. The SEM would utilize voltage contrast generated by potential differences between conductors, typically metal layers, in the semiconductor device. However, one of ordinary skill in the art will readily recognize that a conventional SEM requires relatively close contact with conductors in order to obtain sufficient voltage contrast. If dielectric layers cover the conductive layers, the contrast in the image generated by the conventional SEM is weakened. As a result, the image from the conventional SEM may not adequately indicate the location of components of the semiconductor image. The poor contrast in the image may make it difficult or impossible to determine the physical location of components in the semiconductor device. It is possible to remove dielectric passivation layers, then use the conventional SEM to detect voltage contrast on the exposed top layer of the semiconductor device. However, one of ordinary skill in the art will realize that it may still not be possible to obtain sufficient contrast for lower layers of the device. In addition, removal of the dielectric layer(s) may adversely affect the performance of the device. If the device does not function, it may be impossible to generate the desired voltages in components of the device and, therefore, difficult or impossible to determine the locations of components in the semiconductor device. Consequently, physical verification of the architecture of the semiconductor device may be difficult or impossible using conventional techniques.

Accordingly, what is needed is a system and method for verifying the architecture of a semiconductor device. The present invention addresses such a need.

SUMMARY OF THE INVENTION

The present invention provides a method and system for verifying an architecture of a semiconductor device. The method and system comprise providing a tester, a detector and an image processing unit. The tester applies at least one voltage to at least one selected portion of the semiconductor device. The at least one voltage is sufficient for the at least one selected portion of the semiconductor device to produce a particular level of radiation. The detector detects the radiation. The image processing unit is coupled with the detector and the tester. The image processing unit captures an image from the detector. The image indicates at least one physical location of the at least one selected portion of the semiconductor device. The architecture of the memory device can be verified by comparing the at least one selected portion of the semiconductor device to the at least one physical location.

According to the system and method disclosed herein, the present invention provides a mechanism for verifying the physical architecture of the semiconductor device without removing certain dielectric layers, which would render the device nonfunctional.

DETAILED DESCRIPTION OF THE INVENTION

The present invention provides a method and system for verifying an architecture of a semiconductor device. The method and system comprise providing a tester, a detector and an image processing unit. The tester applies at least one voltage to at least one selected portion of the semiconductor device. The at least one voltage is sufficient for the at least one selected portion of the semiconductor device to produce a particular level of radiation. The detector detects the radiation. The image processing unit is coupled with the detector and the tester. The image processing unit captures an image from the detector. The image indicates at least one physical location of the at least one selected portion of the semiconductor device. The architecture of the memory device can be verified by comparing the at least one selected portion of the semiconductor device to the at least one physical location.

The present invention will be described in terms of a particular testing system having certain components and a method having certain steps. However, one of ordinary skill in the art will readily recognize that this method and system will operate effectively for testing systems having other and/or additional components. In addition, one of ordinary skill in the art will also readily recognize that the method may include other and/or additional steps that, for clarity, are not depicted. The present invention will be described in terms of the physical verification of the architecture of certain semiconductor devices. However, the present invention is consistent with the testing of other semiconductor devices. One of ordinary skill in the art will also readily recognize that for clarity, only certain portions of the semiconductor devices are depicted.

Figure 1A:
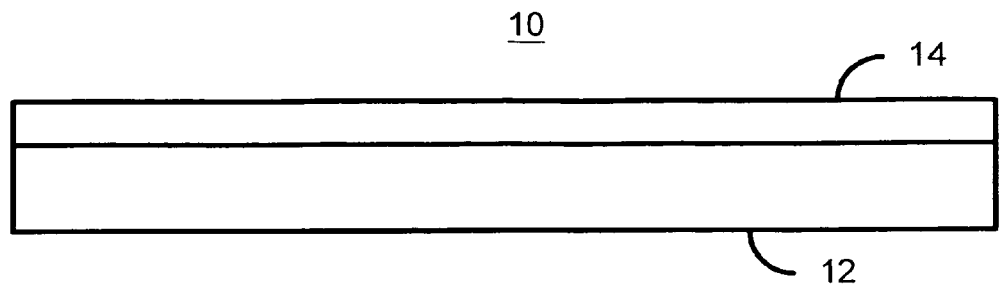
FIG. 1A is a side view of a semiconductor device.
Figure 1B:
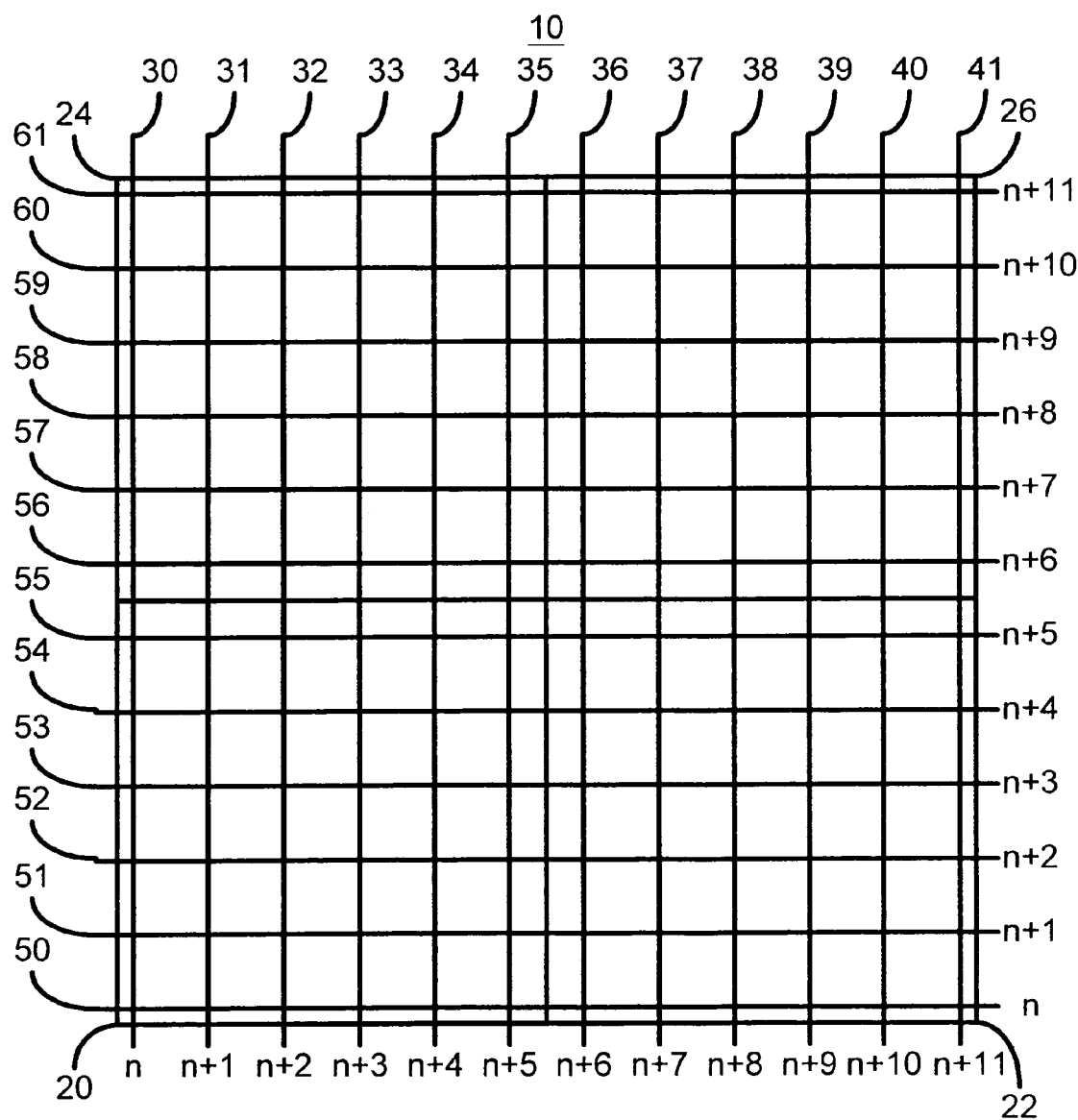
FIG. 1B is a plan view of the semiconductor device.

FIGS. 1A and 1B are side and plan views of a semiconductor device 10 for which the architecture is desired to be physically verified. The semiconductor device 10 includes a substrate 12 and an active region 14. The active region 14 includes blocks 20, 22, 24 and 26. Each block 20, 22, 24 and 26 includes a number of devices (not explicitly shown). Columns n 30 through 41 and rows n 50 through (n+11) 61 are also disclosed. A particular site may be selected by activating one of the columns 30–41 and one of the rows n 50 through (n+11) 61. As discussed above, it is desired to physically verify the architecture of the semiconductor device 10.

Figure 2:
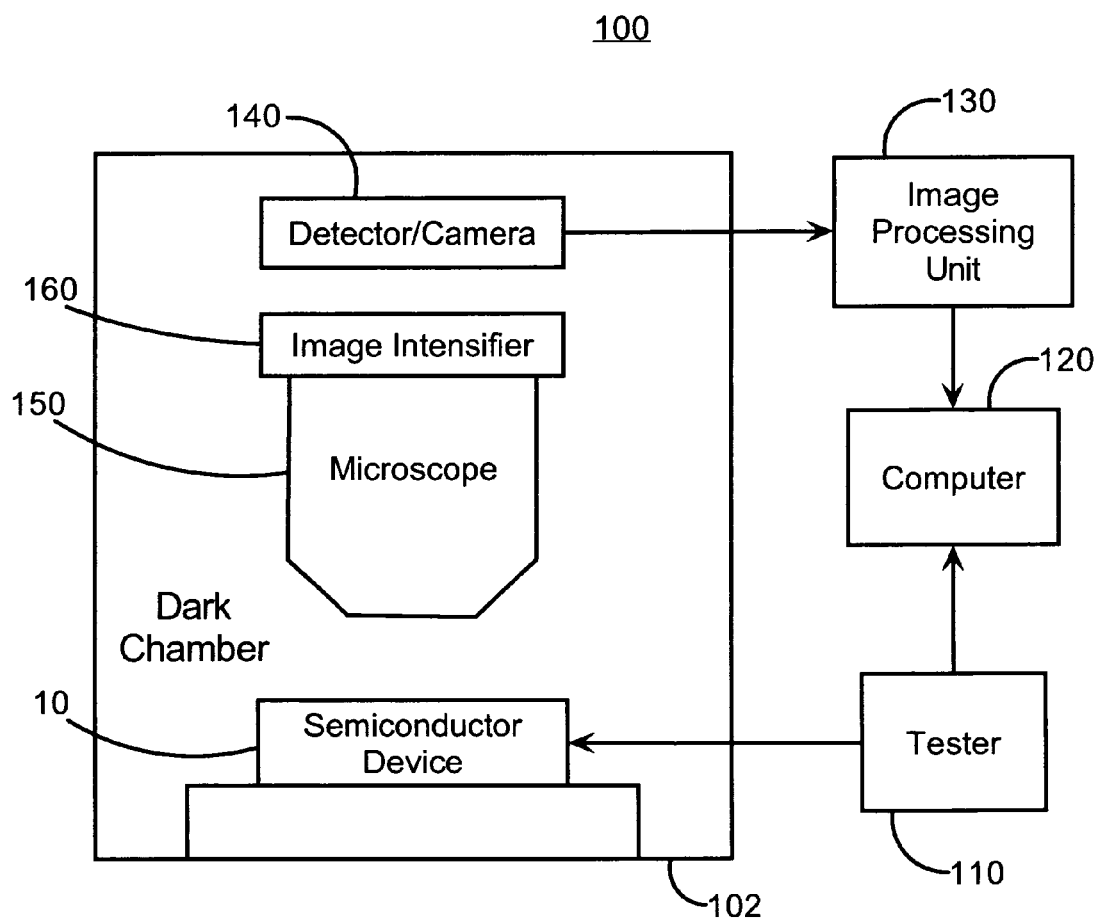
FIG. 2 is a block diagram depicting one embodiment of a system in accordance with the present invention for physically verifying the architecture of a semiconductor device.

FIG. 2 is a block diagram depicting one embodiment of a system 100 in accordance with the present invention for physically verifying the architecture of a semiconductor device, such as the semiconductor device 10. The system 100 preferably uses a dark chamber 102 to hold the semiconductor device 10 during testing. The chamber 102 is considered to be a dark chamber because the chamber 102 isolates the semiconductor device 10 from external radiation that may interfere with physical verification of the architecture. Note that the chamber 102 may not need to isolate the semiconductor device 10 from all external radiation. In one embodiment, the semiconductor device 10 is isolated from radiation in particular spectral range(s) from which radiation is expected during testing.

The system 100 includes a tester 110, an image processing unit 130 and a detector 140. The system 100 also preferably includes a computer 120, a microscope 150 and an image intensifier 160. The semiconductor device 10 is preferably placed in the dark chamber 102. The tester 110 is used to provide voltage(s) to selected portions of the semiconductor device 10. The tester 110 generates a series of addresses in the semiconductor device 10, preferably in read mode. The tester 110 provides a voltage to each of the addresses generated. The voltage provided causes selected portions of the semiconductor device 10 to generate sufficient radiation to be detected by the detector 140. In a preferred embodiment, the voltage provided by the tester 110 is used to drive MOS transistors in the semiconductor device 10 into saturation. For example, in Flash Memory or SRAM, in read or write mode, one or more MOS transistors in a memory cell can be forced to operate in the saturation region. Generally, operation in the saturation region results in current being carried away from the memory cell by the conductors in the region. As a result, joule heating and black body radiation is generated. The levels of the voltages provided by the tester 110 are set to provide a sufficient level of radiation.

The detector 140 detects the radiation generated by the semiconductor device 10 under the influence of voltages provided by the tester 110. In a preferred embodiment, the radiation generated by the semiconductor device 10 is enhanced by the image intensifier 160. In addition, the image detected by the detector 140 is magnified by the microscope 150. As a result, the radiation sensed by the detector 140 can be correlated to portions of the semiconductor device 10. In a preferred embodiment, the detector 140 includes a camera or other photosensitive array. The detector 140 preferably provides data to the image processing unit, which processes the data from the detector 140. The image processing unit preferably provides data to the computer 120. In a preferred embodiment, the computer 120 analyzes the data provided by the image processing unit 130 to determine the location of the radiation. In addition, the computer 120 receives data from the tester 110 indicating the component/portion of the semiconductor device 10 that is being tested. As a result, the computer 120 can correlate the physical location provided by the image processing unit 130 and the component in the architecture indicated by the tester 110. Thus, the computer 120 preferably physically verifies the architecture. However, in an alternate embodiment, location of the radiation detected by the detector 140 can be correlated with the architecture in another fashion, including by hand.

Figure 3:
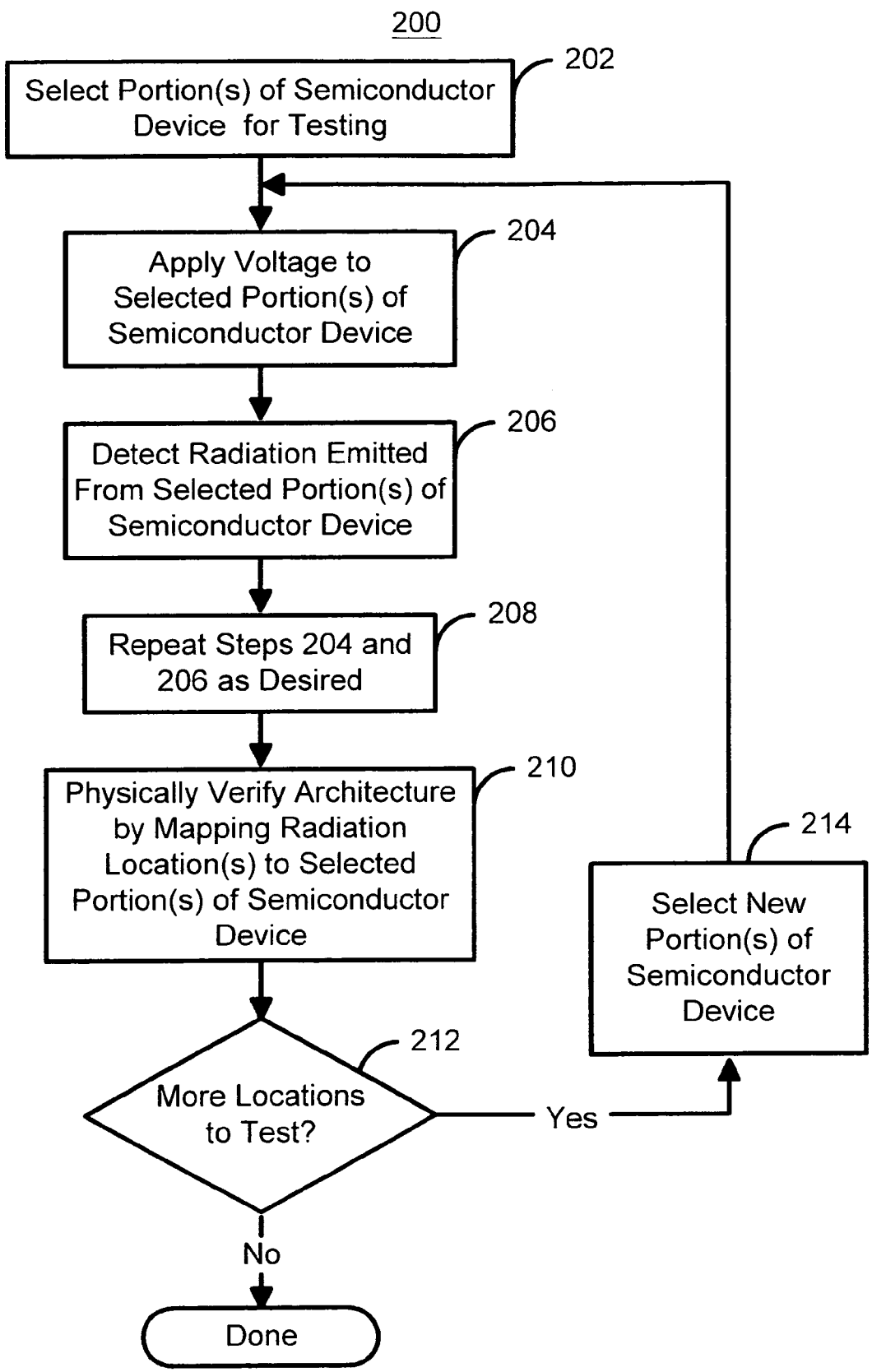
FIG. 3 is a high-level flow chart depicting one embodiment of a method in accordance with the present invention for physically verifying the architecture of a semiconductor device.

FIG. 3 is a high-level flow chart depicting one embodiment of a method 200 in accordance with the present invention for physically verifying the architecture of a semiconductor device. The method 200 is described in connection with the system 100 and the semiconductor device 10. A portion of the semiconductor device 10 is selected for testing, via step 202. Preferably, step 202 includes selecting a specific component, such as a specific memory cell, for testing. Step 202 may be performed by the tester 110, which determines which address to test at a particular time. The tester 110 then applies the test voltage to the appropriate address(es), via step 204. The tester 110 preferably applies a voltage that will saturate transistors in the selected portion(s) of the semiconductor device 10. In a preferred embodiment, in step 204 the tester 110 also sends a trigger to the computer 120. The trigger causes the computer 120 to trigger the detector 140 to capture the radiation, via step 206. Thus, the radiation emitted by the semiconductor device 10 is detected. Consequently, the location of the radiation captured by the detector 140 should correspond to the portion of the semiconductor device 10 to which the tester 110 applies a voltage. Steps 204 and 206 are repeated a desired number of times, via step 208. As a result, additional data may be obtained for the portion of the semiconductor device 10. The physical location of the radiation sensed by the detector 140 is correlated with the address to which the voltage was applied, via step 210. Step 210 thus physically verifies the architecture of a particular component of the semiconductor device 10. It is determined whether there are any additional components of the semiconductor device 10 for which the architecture is desired to be physically verified, via step 212. If so, a new portion of the semiconductor device 10 is selected, via step 214. Steps 204 through 212 are then returned to in order to physically verify the architecture of the new portion of the semiconductor device 10.

Thus, using the method 200 and system 100, the architecture of a semiconductor device 10 may be physically verified. As a result, the physical locations of portions of the semiconductor device can be determined and failure analysis simplified.

Figure 4A:
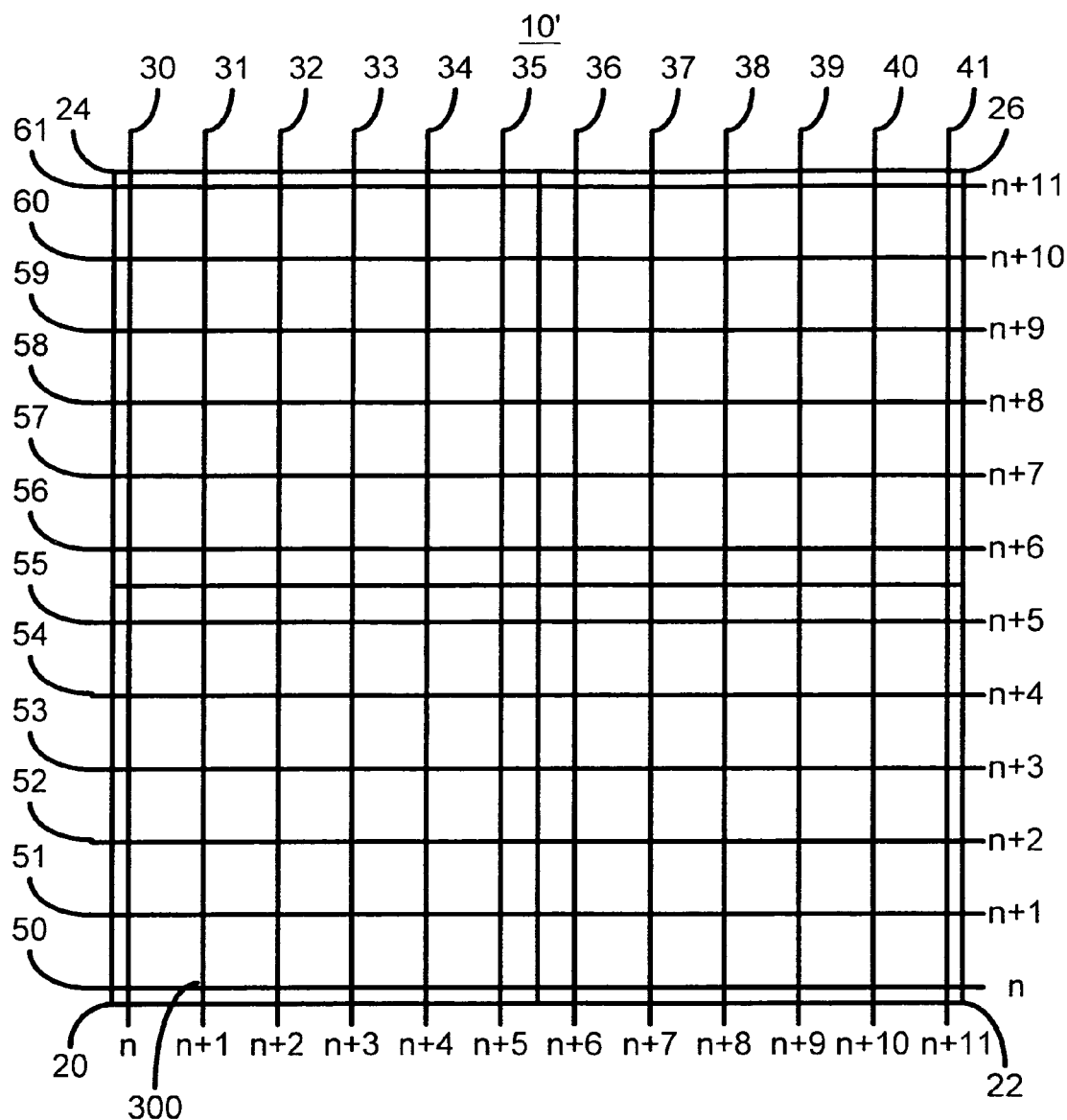
FIG. 4A is a plan view of the semiconductor device during physical verification of a first component in the memory architecture using one embodiment of the method and system in accordance with present invention.
Figure 4B:
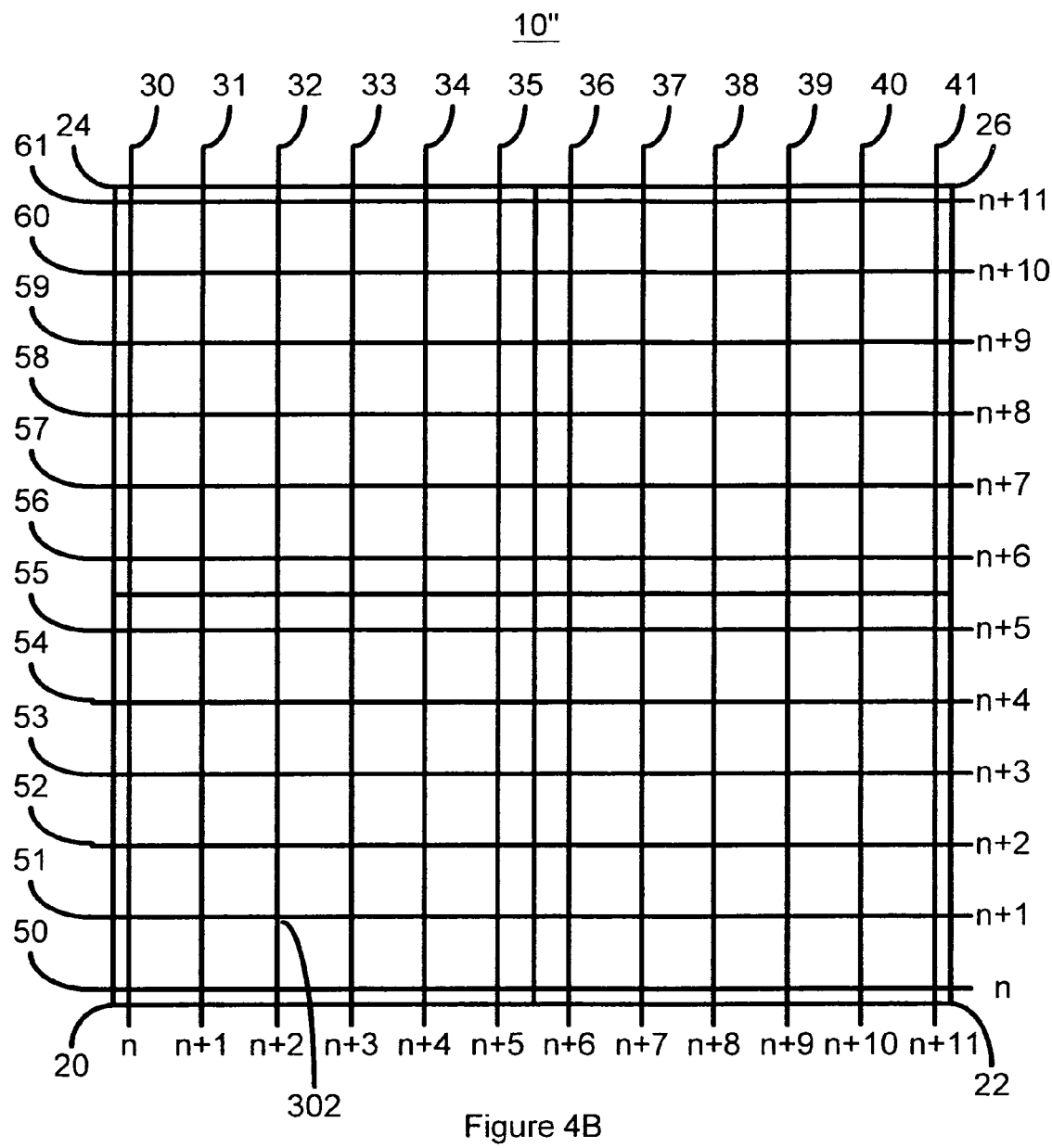
FIG. 4B is a plan view of the semiconductor device during physical verification of a second component in the memory architecture using one embodiment of the method and system in accordance with present invention.

FIG. 4A is a plan view of the semiconductor device 10' during physical verification of a first component in the memory architecture using one embodiment of the method 200 and system 100 in accordance with present invention. FIG. 4B is a plan view of the semiconductor device 10" during physical verification of a second component in the memory architecture using one embodiment of the method 200 and system 100 in accordance with present invention. In particular, the locations of the radiation emitted for different components 300 and 302 are depicted. Thus, based upon the locations 300 and 302 of the radiation, the times at which the voltages are applied and the times at which the radiation is detected, the physical location 300 and 302 of the corresponding components can be verified.

Figure 5A:
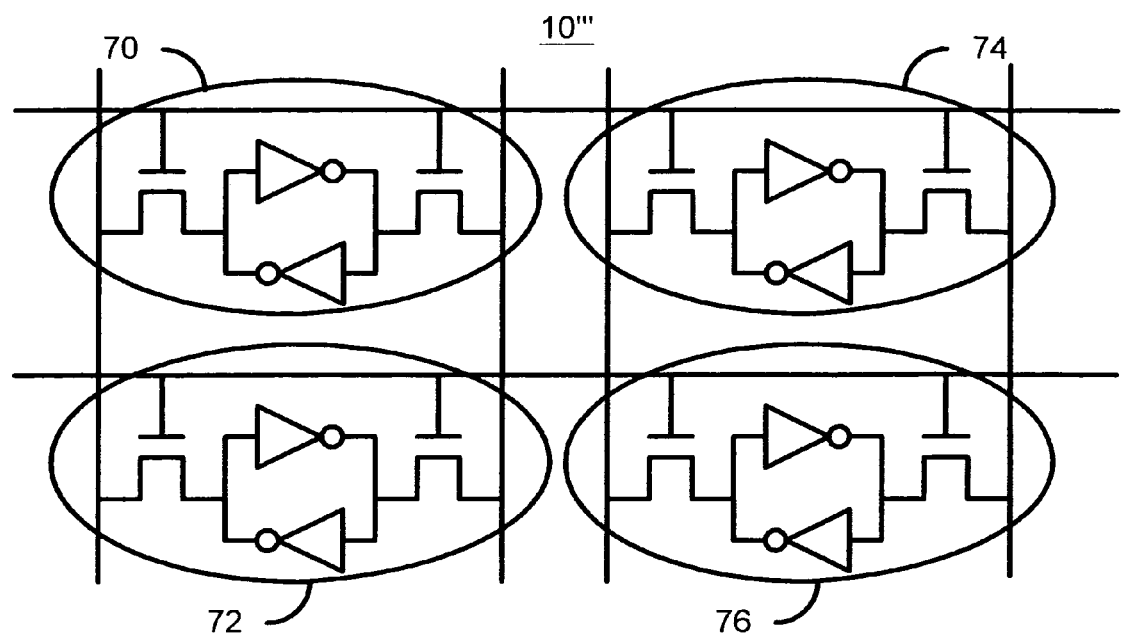
FIG. 5A is a diagram of the architecture of an SRAM semiconductor device that can be physically verified using one embodiment of the method and system in accordance with present invention.
Figure 5B:
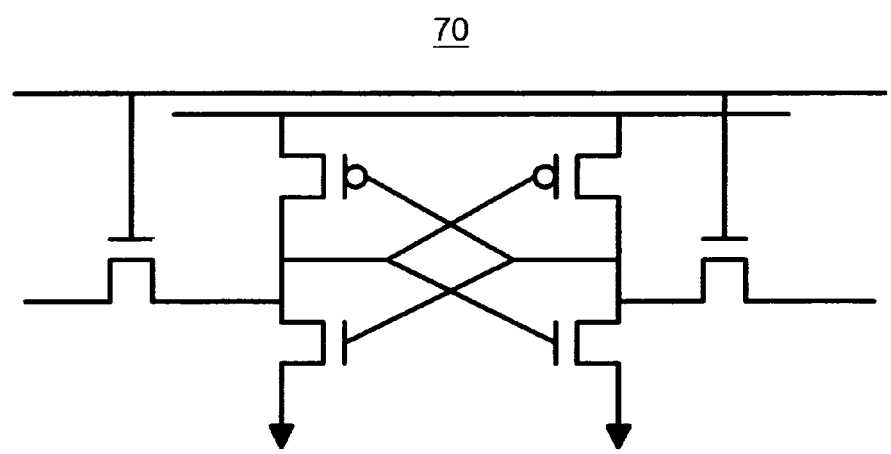
FIG. 5B is a diagram of a single cell in the SRAM semiconductor device that can be physically verified using one embodiment of the method and system in accordance with present invention.

FIG. 5A is a diagram of the architecture of an SRAM semiconductor device 10''' that can be physically verified using one embodiment of the method and system in accordance with present invention. The semiconductor device 10''' includes single cells 70, 72, 74, and 76. FIG. 5B is a diagram of a single cell 70 in the SRAM semiconductor device 10''' that can be physically verified using one embodiment of the method and system in accordance with present invention. Voltages are applied during the write "0" and write "1" cycles. Thus, the transistors in one or more of the cells 70, 72, 74, and 76 are driven into saturation.

Figure 6:
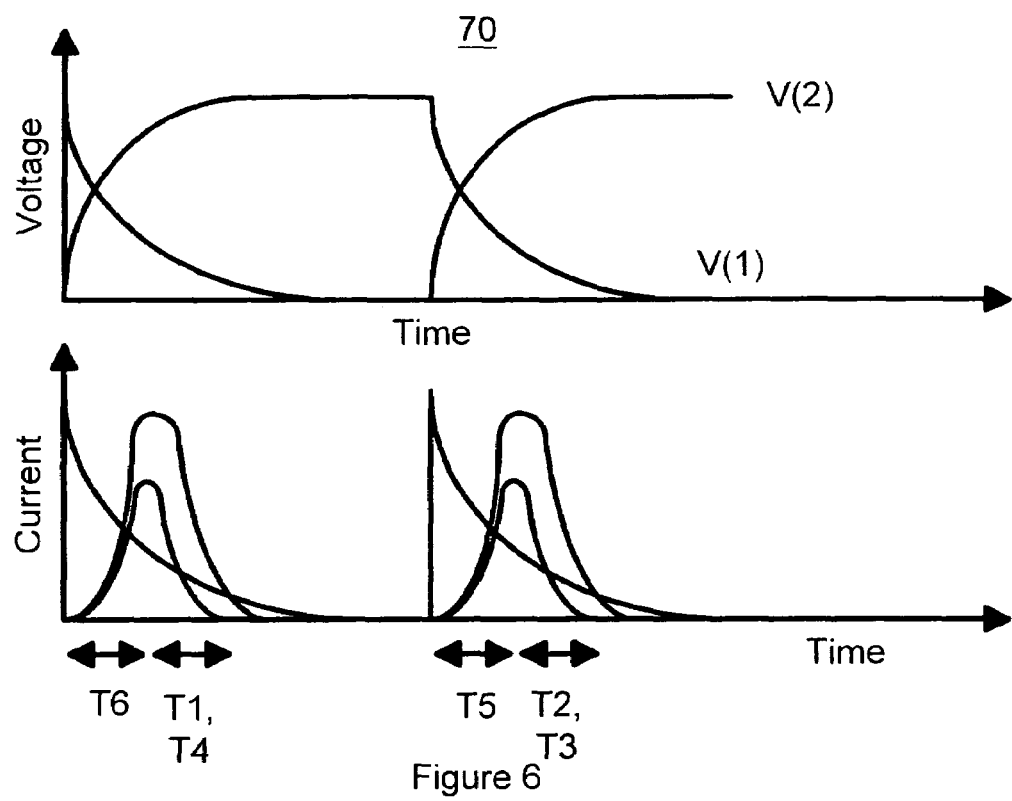
FIG. 6 is a diagram depicting the current and voltages in the SRAM device during physical verification using one embodiment of the method and system in accordance with the present invention.

FIG. 6 is a diagram depicting a graph 310 of current versus time and a graph 312 of voltage versus time in the SRAM device 10''' during physical verification using one embodiment of the method 200 and system 100 in accordance with the present invention. As can be seen in the graph 312, the voltages are applied multiple times. The resulting current is depicted in the graph 310. The radiation emitted by the SRAM device 10''' follows the current generated. Thus, the radiation emitted by the SRAM device 10''' can thus be detected as well as the physical location of the cells 70, 72, 74 and 76. The architecture of the SRAM device 10''' can thus be verified using the method 200 and system 100.

Figure 7:
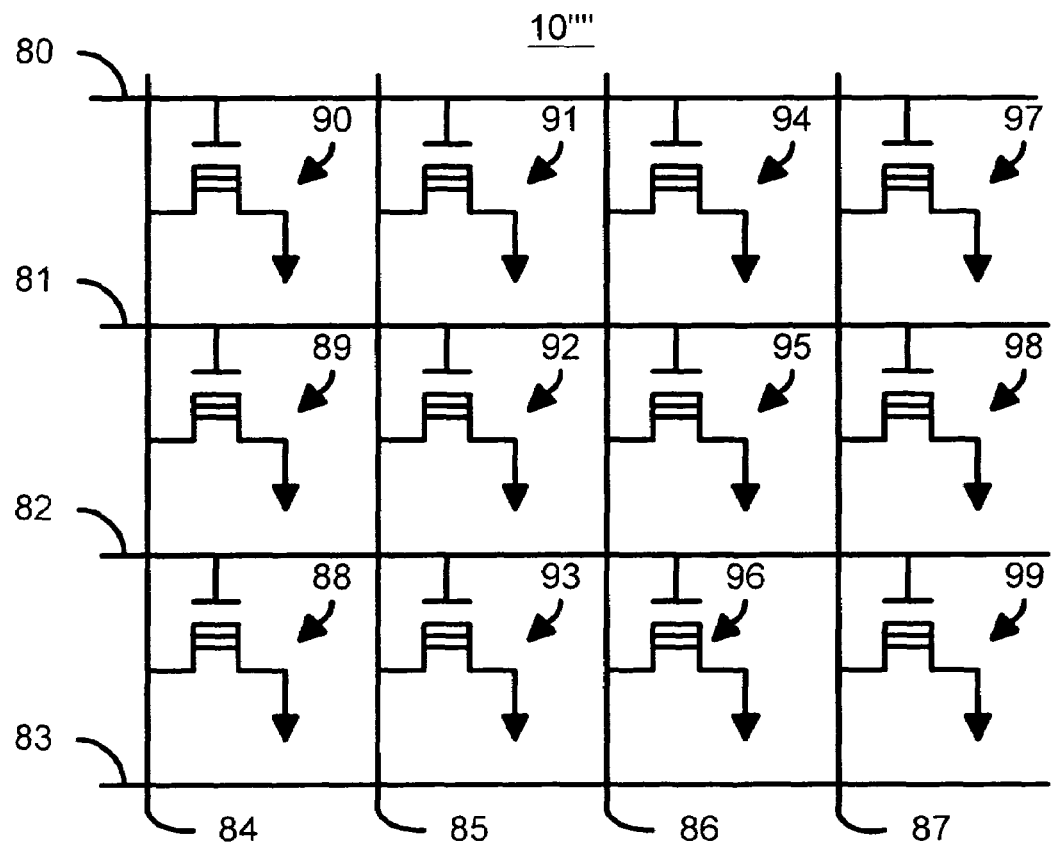
FIG. 7 is a diagram of the architecture of a Flash memory semiconductor device that can be physically verified using one embodiment of the method and system in accordance with present invention.

FIG. 7 is a diagram of the architecture of a portion of a Flash memory semiconductor device 10''' that can be physically verified using one embodiment of the method and system in accordance with present invention. The Flash memory device 10"" comprises word lines 80, 81, 82, 83 and bit lines 84, 85, 86 and 87. At the intersections of the word lines 80, 81, 82, and 83 and the bit lines 84, 85, 86 and 87 are NMOS transistors 88, 89, 90, 91, 92, 93, 94, 95, 96, 97, 98 and 99. In the case of the Flash memory device 10"", all of the cells 88–90 are erased first. The method 200 depicted in FIG. 3 can then be carried out. Referring back to FIG. 7, during read operations, the selected NMOS transistors 88–99 operate in saturation. Thus, one or more of the NMOS 88–99 operate in saturation. Consequently, the selected NMOS transistors 88–99 will emit radiation that can be detected by the system 100. Thus, the architecture of the Flash memory device 10"" can be physically verified using the system 100 and method 200.

A method and system has been disclosed for physically verifying the architecture of semiconductor devices. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for verifying an architecture of a semiconductor device, the system comprising: a tester for applying at least one voltage to at least one selected portion of the semiconductor device, the at least one voltage being sufficient for the at least one selected portion of the semiconductor device to produce a particular level of radiation;
   a detector for detecting the radiation;
   an image processing unit coupled with the detector and the tester, the image processing unit for capturing an image from the detector, the image indicating at least one physical location of the at least one selected portion of the semiconductor device, the architecture of the semiconductor device being verified by correlating the at least one selected portion of the semiconductor device to the at least one physical location.

2. The system of claim 1 further comprising:
   a computer coupled to the image processing unit and the tester, the computer for synchronizing the image processing unit with the tester.

3. The system of claim 2 wherein the computer further compares the at least one selected portion of the semiconductor device with the at least one physical location.

4. The system of claim 1 further comprising:
   a microscope coupled with the detector for magnifying the at least one physical location.

5. The system of claim 4 further comprising:
   an image intensifier coupled with the microscope and the detector, the image intensifier for increasing an intensity of the radiation.

6. The system of claim 1 wherein the radiation has a spectral range and wherein the detector is configured for detecting the spectral range of the radiation.

7. The system of claim 1 further comprising:
   a chamber for enclosing the semiconductor device, the chamber shielding the semiconductor device and the detector from external radiation.

8. A method for verifying an architecture of a semiconductor device, the system comprising the steps of:
   (a) applying at least one voltage to at least one selected portion of the semiconductor device, the at least one voltage being sufficient for the at least one selected portion of the semiconductor device to produce a particular level of radiation;

(b) detecting the radiation;
(c) capturing an image of the radiation detected, the image indicating at least one physical location of the at least one selected portion of the semiconductor device; and
(d) correlating the at least one selected portion of the semiconductor device to the at least one physical location to verify the architecture of the semiconductor device.

9. The method of claim 8 further comprising the step of;
(e) synchronizing the image capturing step (c) with the voltage applying step (a).

10. The method of claim 9 wherein the comparing step (d) further includes the step of:
(d1) using a computer to compare the at least one selected portion of the semiconductor device with the at least one physical location.

11. The method of claim 8 further comprising the step of;
(e) magnifying the at least one physical location for the detecting step (b).

12. The method of claim 11 further comprising the step of;
(f) increasing an intensity of the radiation prior to detecting the radiation in step (b).

13. The method of claim 8 wherein the radiation has a spectral range and wherein the detecting step (b) further includes the step of;
(b1) detecting the spectral range of the radiation.

14. The method of claim 8 further comprising the step of;
(c) placing the semiconductor device in a chamber for testing, the chamber shielding the semiconductor device and the detector from external radiation.

* * * * *

UNITED STATES PATENT AND TRADEMARK OFFICE
CERTIFICATE OF CORRECTION

| | | |
|---|---|---|
| PATENT NO. | : 6,941,529 B1 | Page 1 of 1 |
| APPLICATION NO. | : 10/288959 | |
| DATED | : September 6, 2005 | |
| INVENTOR(S) | : Shivananda Shetty, W. Eugen Hill and Mehrdad Mahanpour | |

It is certified that error appears in the above-identified patent and that said Letters Patent is hereby corrected as shown below:

On the last page, claim 9, column 7, line 9, please replace ";" with -- : --.

On the last page, claim 11, column 8, line 1, please replace ";" with -- : --.

On the last page, claim 12, column 8, line 4, please replace ";" with -- : --.

On the last page, claim 13, column 8, line 9, please replace ";" with -- : --.

On the last page, claim 14, column 8, line 11, please replace ";" with -- : --.

Signed and Sealed this

Fourth Day of March, 2008

JON W. DUDAS
*Director of the United States Patent and Trademark Office*